United States Patent
Claisse et al.

[11] Patent Number: 6,016,326
[45] Date of Patent: Jan. 18, 2000

[54] METHOD FOR BIASING SEMICONDUCTOR LASERS

[75] Inventors: Paul Robert Claisse; Philip Anthony Kiely, both of Gilbert, Ariz.

[73] Assignee: Motorola, Inc., Schaumburg, Ill.

[21] Appl. No.: 08/990,267

[22] Filed: Dec. 15, 1997

[51] Int. Cl.$^7$ .................................................. H01S 3/19
[52] U.S. Cl. ................... 372/44; 372/26; 372/28; 372/29; 372/32; 372/38; 372/43; 372/46
[58] Field of Search ................................ 372/20, 25, 26, 372/28, 29, 32, 33, 38, 43, 44, 45, 46, 50

[56] References Cited

U.S. PATENT DOCUMENTS

| | | | |
|---|---|---|---|
| 4,385,387 | 5/1983 | Trimmel | 372/29 |
| 4,504,976 | 3/1985 | Beaudet | 372/31 X |
| 4,698,817 | 10/1987 | Burley | 372/31 |
| 4,918,396 | 4/1990 | Halemane et al. | 372/31 X |
| 4,995,045 | 2/1991 | Burley et al. | 372/38 |
| 5,187,713 | 2/1993 | Kwa | 372/26 |
| 5,809,049 | 9/1998 | Schaefer et al. | 372/38 |
| 5,850,409 | 12/1998 | Link | 372/38 |

OTHER PUBLICATIONS

"Microcavity Vacuum–Field Configuration and the Spontaneous Emission Power" by T. Zhang, J.G. Wohlbier, Kent D. Choquette, and N. Tabatabaie, IEEE Journal of Selected Topics in Quantum Electronics, vol. 1, No. 2, Jun. 1995, pp. 606–615.

"Optische Betriebssysteme für den Weitverkehr" by Horst Kleinmann, Ernst Kremers, Ralf–Michael Stach, Friedrich–Christian Tischer, ANT Nachrichtentechnische Berichte Heft, Dec. 3, 1986, pp. 95–112.

"Monolithisch integrierte Bausteine für Systeme der optischen Nachrichtentechnik" by Wolfgang Bambach, Gerd Mühlnikel, Bernhard Schwaderer, Horst Wernz, Theodor Wiesmann, ANT Nachrichtentechnische Berichte Heft, May 4, 1987, pp. 42–47.

*Primary Examiner*—Brian Healy
*Attorney, Agent, or Firm*—Anthony M. Martinez; William E. Koch

[57] ABSTRACT

A method for biasing a semiconductor laser (12) at the threshold level of the semiconductor laser (12). The method includes applying pilot tone signals having the same frequency to a bias current and a drive current of the semiconductor laser (12). A lateral detector (13) generates a photocurrent from spontaneous emissions of the semiconductor laser (12). Further, the method includes biasing the semiconductor laser (12) using a pilot tone signal of the photocurrent.

20 Claims, 1 Drawing Sheet

METHOD FOR BIASING SEMICONDUCTOR LASERS

BACKGROUND OF THE INVENTION

The present invention relates, in general, to lasers and, more particularly, to biasing a semiconductor laser.

Optical communications, Compact Disc (CD) players, and bar code scanners use semiconductor lasers, such as Vertical Cavity Surface Emitting Lasers (VCSELs) and edge emitting lasers. An edge emitting laser typically includes layers of semiconductor material formed on a substrate. More particularly, an edge emitting laser includes a junction formed between two semiconductor materials of opposite conductivity type that are adjacent to each other. The edge emitting laser emits light in a direction parallel to its substrate when electrical current is driven through it. On the other hand, a VCSEL includes an active area disposed between two mirror stacks formed on a substrate. The VCSEL emits light in a direction perpendicular to its substrate when electrical current is driven though it.

In operation, a threshold level of current must be forced through the semiconductor laser for lasing to occur. The threshold level is reached when the stimulated emissions exceed the internal losses and mirror losses. Upon reaching the threshold level, the amount of emitted light rises with the current. In high speed optical transmission systems, it is desirable for the semiconductor laser to have a high operating speed. Since the semiconductor laser needs to reach a threshold level before lasing occurs, a delay is incurred between when the drive signal is applied and when lasing occurs in the semiconductor laser.

Biasing or pre-biasing of the semiconductor laser overcomes the lag time of reaching the threshold level of the semiconductor laser. Determining the extent of the bias is a problem since the threshold level of the semiconductor laser varies substantially as a result of temperature fluctuations and degradation of the semiconductor laser over time. Generally, manufacturers of semiconductor lasers use a back facet photodetector to determine the extent of the bias. This approach is not simple for VCSELs where the back facet is the substrate of the VCSEL, which can absorb the light emitted towards the back facet. Some manufactures form the photodetector underneath the bottom mirror stack of the VCSEL to overcome this problem. However, this requires extra grown layers that increases the manufacturing costs and complexity for manufacturing the devices because of the processing steps needed to contact the photodetector and the bottom mirror stack of the VCSEL.

Accordingly, it would be advantageous to have a method for biasing a semiconductor laser near its threshold level. It would be of further advantage for the method to be compatible with standard semiconductor processes and cost efficient.

DETAILED DESCRIPTION OF THE DRAWINGS

Generally, the present invention provides a method for biasing a semiconductor laser. More particularly, the present invention provides a method for biasing a semiconductor laser at a threshold level of the semiconductor laser. Bias current and drive current are applied to the semiconductor laser. In accordance with the present invention, pilot tone signals are applied to the bias current and the drive current. The pilot tone signals appear in spontaneous emissions of the semiconductor laser. The spontaneous emissions are monitored and used to bias the semiconductor laser. In addition, feedback is employed to alter the bias current and maintain the threshold level of the semiconductor laser.

Figure 1:
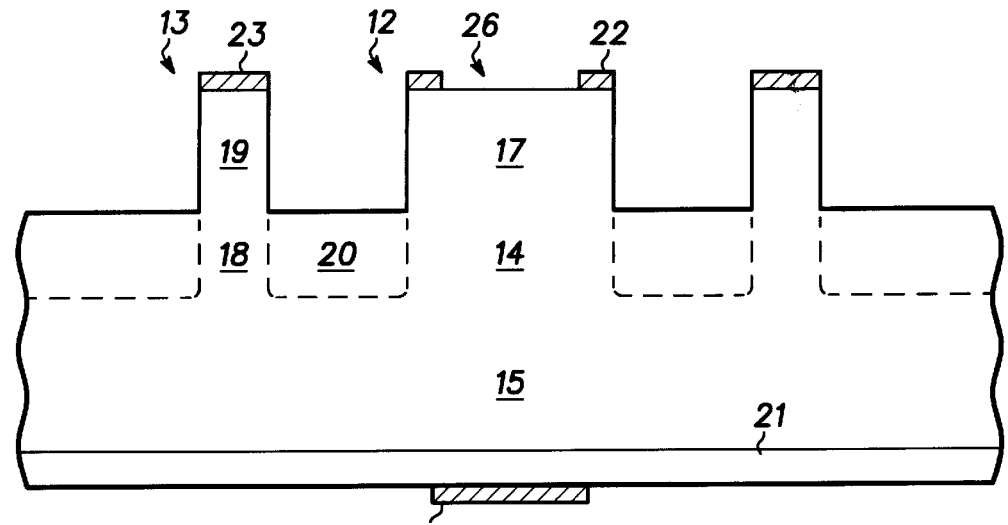
FIG. 1 is a cross-sectional view of a portion of a semiconductor device in accordance with a first embodiment of the present invention.

FIG. 1 is a cross-sectional view of a portion of a semiconductor device 10 in accordance with a first embodiment of the present invention. Semiconductor device 10 includes a Vertical Cavity Surface Emitting Laser (VCSEL) 12 and a monolithically integrated lateral detector 13. VCSEL 12 has an active region 14 disposed between mirror stacks 15 and 17. Lateral detector 13 is adjacent VCSEL 12 and has an active region 18 disposed between mirror stacks 15 and 19. Active region 18 is coextensive with active region 14 and an isolation region 20 is formed in coextensive portions thereof. Mirror stack 15 is formed on a substrate 21. Electrical contacts 22 and 23 are formed on mirror stacks 17 and 19, respectively. Electrical contacts 22 and 23 are referred to as a laser anode and a detector anode, respectively. An electrical contact 24 is formed below the bottom surface of mirror stack 15. Preferably, electrical contact 24 is formed on the bottom surface of substrate 21. Electrical contact 22 defines a window 26 for the emission of light from VCSEL 12.

Active regions 14 and 18 and isolation region 20 can be formed from an active layer (not shown) such as a quantum well. The quantum well can be formed between two cladding layers (not shown). Isolation region 20 is formed by a single or multi-energy implant that isolates electrical contacts 22 and 23. By way of example, laser anode 22 and detector anode 23 are electrically isolated at greater than 1 micro-Ampere by isolation region 20. Mirror stacks 17 and 19 are formed by techniques such as etching.

Figure 2:
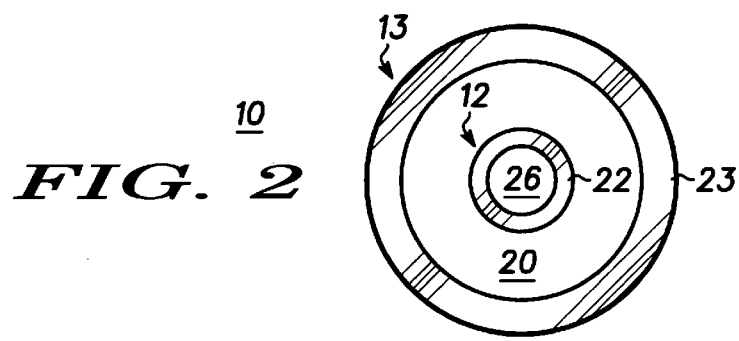
FIG. 2 illustrates a top view of the semiconductor device of FIG. 1.

Briefly referring to FIG. 2, a top view of semiconductor device 10 is illustrated. More particularly, FIG. 2 illustrates a top view of electrical contacts 22 and 23, window 26, and isolation region 20. In addition, FIG. 2 illustrates lateral detector 13 encircling VCSEL 12.

Referring again to FIG. 1, in operation, a voltage applied across electrical contacts 22 and 24 generates a current through VCSEL 12. Lasing generally occurs when a threshold level of current is driven through VCSEL 12. Light is generated in active region 14, is emitted through window 26, and propagates through isolation region 20. The light that propagates through isolation region 20 is known as lateral spontaneous emissions of VCSEL 12. Isolation region 20 acts as a waveguide by directing light from active region 14 to active region 18 of lateral detector 13. Preferably, lateral detector 13 is either reverse biased or has a zero bias. When light is absorbed by active region 18, a photocurrent is generated in lateral detector 13.

In accordance with the present invention, a bias voltage and a drive voltage are applied to VCSEL 12 across electrical contacts 22 and 24. The bias voltage and the drive voltage generate a bias current and a drive current, respectively. Alternatively, a bias current and a drive current can be generated by a bias current source and a drive current source, respectively. The bias current biases VCSEL 12 to a threshold level of VCSEL 12 and the drive current is used for transmitting data via the emitted light of VCSEL 12 through window 26.

Figure 3:
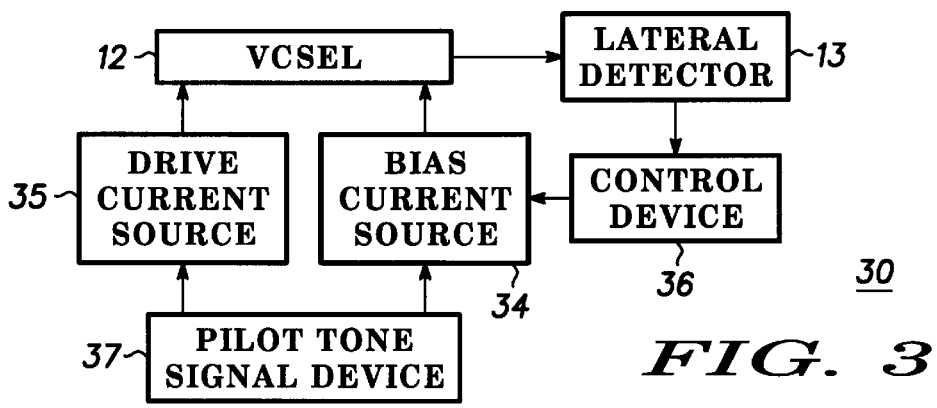
FIG. 3 illustrates a feedback system for biasing the semiconductor device of FIG. 1.

FIG. 3 illustrates a feedback system 30 for biasing VCSEL 12. More particularly, feedback system 30 biases VCSEL 12 to its threshold level using pilot tone signals. In addition, feedback system 30 maintains biasing at the threshold level of VCSEL 12. Feedback system 30 is comprised of VCSEL 12 coupled to lateral detector 13, a bias current source 34, and a drive current source 35. A control device 36 is connected to lateral detector 13 and bias current source 34. Bias current source 34 and drive current source 35 are connected to a pilot tone signal device 37.

In operation, lateral detector 13 receives spontaneous emissions from VCSEL 12 and generates a photocurrent as described hereinbefore. Drive current source 35 provides drive current to VCSEL 12 and bias current source 34 provides bias current to VCSEL 12. Pilot tone signals having the same frequency are applied to the bias current and the drive current by pilot tone signal device 37. The pilot tone signal applied to the bias current is also referred to as a bias pilot tone signal and the pilot tone signal applied to the drive current is also referred to as a drive pilot tone signal. The bias pilot tone signal combines with the drive pilot tone signal and a resultant pilot tone signal appears in the spontaneous emissions of VCSEL 12. In other words a pilot tone signal is generated in the spontaneous emissions of VCSEL 12 from the bias pilot tone signal and the drive pilot tone signal. The pilot tone signal of the spontaneous emissions is also referred to as an emissions pilot tone signal. The frequency of the emissions pilot tone signal is equal to the frequency of the bias pilot tone signal and the frequency of the drive pilot tone signal. The emissions pilot tone signal also appears in the photocurrent generated in lateral detector 13 by spontaneous emissions of VCSEL 12.

Preferably, the bias pilot tone signal is 180 degrees out of phase with respect to the drive pilot tone signal. Therefore, the amplitude of the emission pilot tone signal is the difference between the amplitude of the bias pilot tone signal and the amplitude of the drive pilot tone signal. At the threshold level of VCSEL 12, the amplitudes of the bias pilot tone signal and the drive pilot tone signal are set to levels that result in the amplitude of the emissions pilot tone signal having a value of zero. In other words, at the threshold level of VCSEL 12, the amplitude of the emissions pilot tone signal is zero. Control device 36 monitors the emissions pilot tone signal. In addition, control device 36 controls the extent of the bias current provided to VCSEL 12 in accordance with the emissions pilot tone signal. In other words, the bias current provided to VCSEL 12 is increased or decreased in accordance with the emissions pilot tone signal. By way of example, control device 36 includes a device or a circuit for monitoring the frequency of a signal such as, for example, a synchronous detector (not shown).

The threshold level of VCSEL 12 varies as a result of fluctuations in temperature and degradation of VCSEL 12 over time. When the threshold level of VCSEL 12 varies, the amplitude of the emissions pilot tone signal changes to a non-zero value. Control device 36 detects the non-zero amplitude of the emissions pilot tone signal and alters the extent of the bias current provided to VCSEL 12 to maintain biasing of VCSEL 12 at its threshold level. More particularly, control device 36 alters the extent of the bias current provided to VCSEL 12 so that the amplitude of the emissions pilot tone signal is zero.

Figure 4:
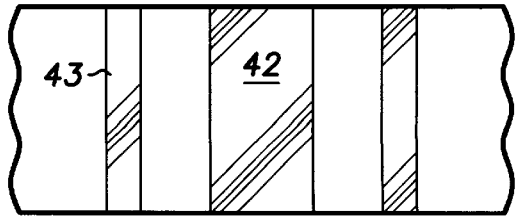
FIG. 4 is a top view of a portion of a semiconductor device in accordance with a second embodiment of the present invention.

FIG. 4 is a top view of a portion of a semiconductor device 40 in accordance with a second embodiment of the present invention. Semiconductor device 40 includes an edge emitting laser 42 and a lateral detector 43. Lateral detector 43 is adjacent edge emitting laser 42.

Lateral detector 43 monitors spontaneous emissions of edge emitting laser 42. A photocurrent is generated in lateral detector 43 by spontaneous emissions of edge emitting laser 42. Edge emitting laser 42 and lateral detector 43 can be used in a feedback system similar to feedback system 30 (FIG. 3) where edge emitting laser 42 replaces VCSEL 12 and lateral detector 43 replaces lateral detector 13. Pilot tone signals can be applied to a bias current and a drive current of edge emitting laser 42. A control device such as, for example, control device 36 (FIG. 3) monitors a pilot tone signal appearing in the photocurrent of lateral detector 43 and controls the extent of the bias current provided to edge emitting laser 42. The control device biases edge emitting laser 42 at its threshold level by monitoring the pilot tone signal appearing in the photocurrent of lateral detector 43.

It should be noted that a second lateral detector (not shown) can be formed on the opposing side of edge emitting laser 42 to maximize the amount of photocurrent or detector current generated.

By now it should be appreciated that a method for biasing a semiconductor laser at its threshold level is provided. An advantage of the present invention is that it provides a method for continuously monitoring and maintaining the threshold level of a semiconductor laser. Another advantage of the present invention is that it is compatible with both VCSELs and edge emitting lasers.

We claim:

1. A method for biasing a semiconductor laser, comprising the steps of:

applying pilot tone signals to a bias current and a drive current of the semiconductor laser; and monitoring spontaneous emissions of the semiconductor laser to maintain a threshold level of the semiconductor laser.

2. The method of claim 1, wherein the step of applying includes applying pilot tone signals having equal frequency to the bias current and the drive current of the semiconductor laser.

3. The method of claim 1, wherein the step of applying further includes applying a first pilot tone signal to the bias current and applying a second pilot tone signal to the drive current.

4. The method of claim 3, wherein the first pilot tone signal is 180 degrees out of phase with respect to the second pilot tone signal.

5. The method of claim 1, wherein the step of monitoring the spontaneous emissions of the semiconductor laser includes monitoring the lateral spontaneous emissions of the semiconductor laser.

6. The method of claim 1, wherein the step of monitoring the spontaneous emissions of the semiconductor laser includes monitoring a pilot tone signal of the spontaneous emissions of the semiconductor laser.

7. The method of claim 1, wherein the step of monitoring the spontaneous emissions of the semiconductor laser includes providing a lateral detector for monitoring the spontaneous emissions of the semiconductor laser.

8. The method of claim 1, wherein the step of monitoring includes providing a feedback system to maintain the threshold level of the semiconductor laser.

9. A method for biasing a semiconductor laser, comprising the steps of:

applying a first pilot tone signal to a bias current of the semiconductor laser;

applying a second pilot tone signal to a drive current of the semiconductor laser;

generating a pilot tone signal in spontaneous emissions of the semiconductor laser; and biasing the semiconductor laser to a threshold level of the semiconductor laser in accordance with the pilot tone signal of the spontaneous emissions.

10. The method of claim 9, further including the step of generating a photocurrent from spontaneous emissions of the semiconductor laser and wherein the step of biasing includes biasing the semiconductor laser to a threshold level of the semiconductor laser in accordance with a pilot tone signal of the photocurrent.

11. The method of claim 10, wherein the step of generating a photocurrent from spontaneous emissions of the semiconductor laser includes providing a lateral detector for generating the photocurrent from the spontaneous emissions.

12. The method of claim 9, wherein the step of generating further includes generating the pilot tone signal in the spontaneous emissions of the semiconductor laser from the first pilot tone signal and the second pilot tone signal.

13. The method of claim 9, wherein the step of applying a second pilot tone signal to a drive current of the semiconductor laser includes applying the second pilot tone signal to the drive current of the semiconductor laser 180 degrees out of phase with respect to the first pilot tone signal.

14. The method of claim 9, further including the step of setting an amplitude of the pilot tone signal in the spontaneous emissions to zero at the threshold level of the semiconductor laser.

15. The method of claim 9, further including the step of setting an amplitude of the first pilot tone signal and an amplitude of the second pilot tone signal so that an amplitude of the pilot tone signal of the spontaneous emissions is zero at the threshold level of the semiconductor laser.

16. The method of claim 9, wherein a frequency of the first pilot tone signal is equal to a frequency of the second pilot tone signal.

17. The method of claim 9, further including the step of providing a feedback system to maintain the threshold level of the semiconductor laser.

18. A method for biasing a semiconductor laser, comprising the steps of:

providing a semiconductor laser;

providing a first current source for applying a bias current to the semiconductor laser;

providing a second current source for applying a drive current to the semiconductor laser;

applying a first pilot tone signal to the bias current;

applying a second pilot tone signal to the drive current;

forming a lateral detector adjacent to the semiconductor laser for generating a photocurrent from spontaneous emissions of the semiconductor laser; and providing a control device for monitoring the photocurrent and altering the bias current provided to the semiconductor laser by the first current source.

19. The method of claim 18, wherein the step of providing a control device for monitoring the photocurrent further includes providing a control device for monitoring a pilot tone signal of the photocurrent and altering the bias current provided to the semiconductor laser by the first current source so that an amplitude of the pilot tone signal of the photocurrent is zero.

20. The method of claim 18, wherein the step of providing a semiconductor laser comprises providing a Vertical Cavity Surface Emitting Laser (VCSEL).

* * * * *